United States Patent
Kono et al.

(10) Patent No.: US 12,227,609 B2
(45) Date of Patent: Feb. 18, 2025

(54) THERMOSETTING RESIN COMPOSITION, THERMOSETTING RESIN FILM, THERMOSET FILM, MULTILAYER BODY, PRINTED WIRING BOARD AND METHOD FOR PRODUCING SAME

(71) Applicant: KANEKA CORPORATION, Osaka (JP)

(72) Inventors: Fumiya Kono, Otsu (JP); Masayoshi Kido, Settsu (JP)

(73) Assignee: KANEKA CORPORATION, Osaka (JP)

( * ) Notice: Subject to any disclaimer, the term of this patent is extended or adjusted under 35 U.S.C. 154(b) by 503 days.

(21) Appl. No.: 17/590,111

(22) Filed: Feb. 1, 2022

(65) Prior Publication Data
US 2022/0153909 A1    May 19, 2022

Related U.S. Application Data

(63) Continuation of application No. PCT/JP2020/029365, filed on Jul. 30, 2020.

(30) Foreign Application Priority Data

Aug. 1, 2019    (JP) ................... 2019-142306

(51) Int. Cl.
| | | |
|---|---|---|
| C09D 175/12 | (2006.01) |
| C08G 18/10 | (2006.01) |
| C08G 18/44 | (2006.01) |
| C08G 73/08 | (2006.01) |
| C09D 5/44 | (2006.01) |
| C09D 125/08 | (2006.01) |

(52) U.S. Cl.
CPC ............ *C08G 18/10* (2013.01); *C08G 18/44* (2013.01); *C08G 73/08* (2013.01); *C09D 5/4449* (2013.01); *C09D 125/08* (2013.01); *C09D 175/12* (2013.01)

(58) Field of Classification Search
CPC ... C09D 175/12; C09D 5/4449; C09D 125/08
See application file for complete search history.

(56) References Cited

U.S. PATENT DOCUMENTS

| | | |
|---|---|---|
| 2011/0061915 A1 | 3/2011 | Sekito |
| 2019/0161638 A1 | 5/2019 | Kido et al. |

FOREIGN PATENT DOCUMENTS

| | | |
|---|---|---|
| CN | 107407882 A | 11/2017 |
| JP | H11-92617 A | 4/1999 |
| JP | 2014-065886 A | 4/2014 |
| JP | 2018-168370 A | 11/2018 |
| WO | 2009/147938 A1 | 12/2009 |
| WO | 2014/010524 A1 | 1/2014 |
| WO | 2017/188155 A1 | 11/2017 |

OTHER PUBLICATIONS

International Search Report issued in corresponding International Application No. PCT/JP2020/029365, mailed Sep. 24, 2020, with translation (5 pages).
Written Opinion issued in corresponding International Application No. PCT/JP2020/029365, mailed Sep. 24, 2020 (3 pages).
International Preliminary Report on Patentability issued in corresponding International Application No. PCT/JP2020/029365, mailed Feb. 10, 2022 (5 pages).

*Primary Examiner* — Michael L Leonard
(74) *Attorney, Agent, or Firm* — Osha Bergman Watanabe & Burton LLP

(57) ABSTRACT

A thermosetting resin composition comprises a component (A) that is a compound having an imide group and a carboxy group in one molecule, and a component (B) that is a polymer having a repeating unit represented by the following general formula (1). $R^1$ and $R^2$ in formula (1) are each independently a hydrogen atom or a methyl group. $R^3$ in formula (1) is a hydrogen atom or any substituent, and a plurality of $R^3$s may be bonded to form a ring structure. $R^4$ in formula (1) is a hydrogen atom or an alkyl group. m and n in formula (1) are each independently an integer of 1 or more, and m/n may be 1 to 50.

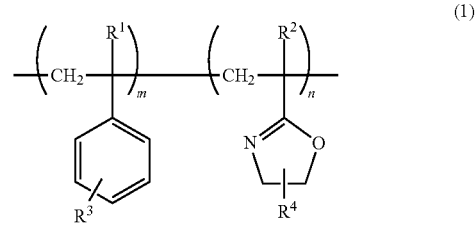

18 Claims, No Drawings

THERMOSETTING RESIN COMPOSITION, THERMOSETTING RESIN FILM, THERMOSET FILM, MULTILAYER BODY, PRINTED WIRING BOARD AND METHOD FOR PRODUCING SAME

TECHNICAL FIELD

One or more embodiments of the present invention relate to a thermosetting resin composition, a thermosetting resin film and a thermally cured film which are suitably used as an interlayer adhesive material in a multilayer printed wiring board. Further, one or more embodiments of the present invention relate to a printed wiring board and a method for manufacturing the printed wiring board.

BACKGROUND

In association with miniaturization, weight reduction and multifunctionality of electronic components, printed wiring boards in devices have been further integrated and multilayered. As a method for multilayering a printed wiring board, a build-up method has attracted attention in which a conductor layer (circuit pattern) and an organic insulating layer are alternately stacked on a board material. An insulating interlayer adhesive material is used for an interlayer bonding between a conductor layer and an organic insulating layer. The interlayer adhesive is required to have embeddability in a circuit pattern and strong adhesiveness with an organic insulating layer (e.g. polyimide or liquid crystal polymer) and a conductor (e.g. copper) forming a circuit.

With an increase in speed and capacity of communication data in recent years, the signals have been increased. In a high frequency band, when the dielectric constant is high, the transmission speed decreases and thus the waveform of the signal is disturbed, so that it is difficult to design a circuit. In addition, when a high-speed signal flows through a wiring, the electric signal turns into heat, and particularly when the dielectric loss is large in the GHz band, the electric signal is significantly attenuated. For this reason, it is required to reduce the dielectric constant and the dielectric loss tangent of an interlayer adhesive material of a printed wiring board which is used in a high frequency band.

For reducing the dielectric constant and the dielectric loss tangent of an interlayer adhesive material, a resin composition for an interlayer adhesive material has been proposed in which a specific material is used. For example, in Patent Document 1, a polyimide obtained using a diamine containing a dimeric diamine as a raw material is used to reduce the dielectric constant and the dielectric loss tangent of an adhesive layer.

PATENT DOCUMENT

Patent Document 1: Japanese Patent Laid-Open No. 2018-168370

An adhesive material obtained using the polyimide disclosed in Patent Document 1 has a small dielectric constant and a small dielectric loss tangent, but since a dimeric diamine having a long chain aliphatic structure is used, the adhesive material has low heat resistance, resulting in swelling and peeling of the adhesive layer during solder reflow, etc. In view of the above, one or more embodiments of the present invention provide a thermosetting resin composition in which a cured film is excellent in dielectric properties and can be applied as an adhesive material having high heat resistance.

SUMMARY

One or more embodiments of the present invention are a thermosetting resin composition including a carboxy group-containing compound as the component (A) and an oxazoline group-containing compound as the component (B). The component (A) is a compound having an imide group and a carboxy group in one molecule, and the component (B) is a polymer having a repeating unit represented by the following general formula (1).

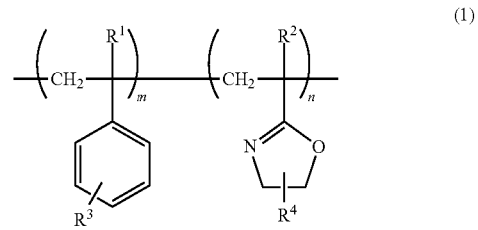

In the general formula (1), $R^1$ and $R^2$ are each independently a hydrogen atom or a methyl group. $R^3$ is a hydrogen atom or any substituent, and a plurality of $R^3$s may be bonded to form a ring structure. The ring structure formed by bonding a plurality of $R^3$s may be an aromatic ring. $R^4$ is a hydrogen atom or an alkyl group. m and n are each independently an integer of 1 or more, and m/n may be 1 to 50.

In the thermosetting resin composition, the molar ratio of the total amount of carboxy groups in the composition to the amount of oxazoline groups in the component (B) may be 0.1 to 3.0.

The acid value of the component (A) may be 5 to 200 mg KOH/g. The component (A) may be an oligomer having a weight average molecular weight of 1,000 to 30,000. The component (A) may have a carboxy group at the terminal of the molecular chain, or may have a carboxy group at the side chain. The carboxy group of the side chain may be directly bonded to the main chain, or the carboxy group may be bonded to the main chain via another functional group.

The component (A) may be a urethane imide oligomer having a carboxy group at the terminal. The urethane imide oligomer having a carboxy group at the terminal may also have a carboxy group at the side chain. The urethane imide oligomer may have a urethane structural unit represented by the general formula (2) and a terminal structure represented by the general formula (3).

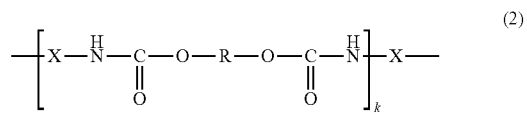

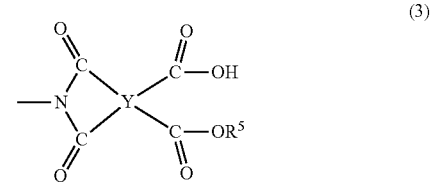

In the general formula (2), R and X are each independently a divalent organic group, and k is an integer of 1 or more. In the general formula (3), Y is a tetravalent organic group, which is a tetracarboxylic dianhydride residue. $R^5$ is a hydrogen atom or an alkyl group.

The urethane imide oligomer may contain polycarbonate urethane in the urethane structure moiety. The polycarbonate urethane contains a carbonate structure (O—CO—O) in the divalent organic group R of the general formula (2).

The thermosetting resin composition may contain, as a component (C), a carboxy group-containing compound other than the component (A). The component (C) may be a compound containing an ethylenically unsaturated group. The component (C) may be a urethane (meth)acrylate having a (meth)acryloyl group at both terminals of the molecular chain.

The thermosetting resin composition may further contain fine particles. The average particle diameter of the fine particles may be 0.1 to 10 μm. The fine particles may act as a flame retardant such as that of a phosphorus compound.

The thermosetting resin composition may be provided as a solution. In addition, the thermosetting resin composition may be provided as a thermosetting resin film formed in a layered shape (film shape). For example, the thermosetting resin composition (solution) is applied onto a support substrate, and the organic solvent is removed to form a laminate including the thermosetting resin film on the support substrate. The support substrate may be a resin film, or a metal foil such as a copper foil. A cover film may be temporarily attached to a surface of the thermosetting resin film provided on the support substrate.

The thermosetting resin film is thermally cured to obtain a thermally cured film. For example, a thermosetting resin film is laminated on a wiring disposed on a board, an organic insulating layer, a conductor, a circuit board and the like are further laminated thereon as necessary, and the thermosetting resin film is then thermally cured to obtain a printed wiring board.

A thermally cured film obtained by thermally curing the thermosetting resin composition has a low dielectric constant and dielectric loss tangent, and is excellent in heat resistance. Thus, the thermosetting resin composition and the thermosetting resin film can be suitably used as an interlayer adhesive material of a multilayer printed wiring board used in a high-frequency band, such as that of an antenna.

DETAILED DESCRIPTION

[Thermosetting Resin Composition]

One or more embodiments of the present invention are a thermosetting resin composition containing (A) a compound having an imide group and a carboxy group, and (B) an oxazoline group-containing compound. The thermosetting resin composition may further contain, as a component (C), a carboxy group-containing compound other than the component (A). The thermosetting resin composition of one or more embodiments is heat-curable because the oxazoline group of the component (B) reacts with the carboxy group of the component (A) (and the component (C)).

Hereinafter, the components contained in the thermosetting resin composition will be described. The following components may be used alone or in combination of two or more thereof unless otherwise specified.

<(A) Compound Having Imide Group and Carboxy Group>

The component (A) is a compound having at least one imide group and at least one carboxy group per molecule. From the viewpoint of reactivity with the component (B) described later, the acid value of the component (A) may be 5 to 200 mg KOH/g, 10 to 150 mg KOH/g, or 15 to 100 mg KOH/g.

The component (A) may be an oligomer having a weight average molecular weight of 1,000 to 30,000 in terms of polyethylene glycol. The weight average molecular weight of the oligomer may be 2,000 to 25,000, 3,000 to 20,000 or 5,000 to 15,000. The oligomer containing an imide group (imide oligomer) may have two or more imide groups per molecule.

Since the component (A) has an imide structure, the resin composition is excellent in stability, and the heat resistance of the cured film obtained by thermal curing tends to be improved. Examples of the imide oligomer having a carboxy group include imide oligomers having a carboxy group at a side chain, and imide oligomers having a carboxy group at a terminal.

The carboxy group at a side chain may be directly bonded to a main chain, or the carboxy group may be bonded to the main chain via another functional group. Examples of the imide oligomer having a carboxy group at a side chain include imide oligomers obtained by imidizing a polyamic acid obtained by a reaction between a diamine having a carboxy group and a tetracarboxylic dianhydride; and imide oligomers obtained by imidizing a polyamic acid, which is obtained by a reaction between a diamine and a tetracarboxylic dianhydride, with some amic acid groups made to remain (imide oligomers with a low imidization ratio).

Examples of the imide oligomer having a carboxy group at the terminal include terminal acid-modified imides. For example, an imide oligomer having a carboxylic acid anhydride group at a terminal is prepared by adding a tetracarboxylic dianhydride in an amount excessive with respect to the equivalent of the diisocyanate compound, and water and/or alcohol are reacted to open the carboxylic acid anhydride group at the terminal, thereby obtaining an imide compound having a carboxyl group at a terminal.

The imide oligomer having a carboxy group at a terminal may have a structural unit other than the imide group. From the viewpoint of solubility in an organic solvent, and flexibility of a thermosetting resin film and a cured film obtained by thermally curing the thermosetting resin film, the component (A) may be a carboxylic acid-terminated urethane imide oligomer. The carboxylic acid-terminated urethane imide oligomer has a repeating unit (urethane structural unit) represented by the following general formula (2), and a structural unit represented by the following general formula (3) at least one terminal.

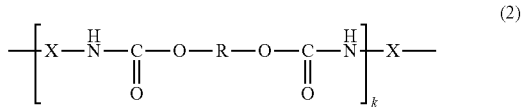

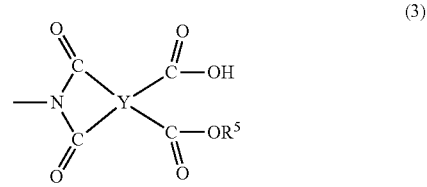

In the general formula (2), X and R are each independently a divalent organic group, and k is an integer of 1 or more. In the general formula (3), Y is a tetravalent organic group, and $R^5$ is a hydrogen atom or an alkyl group. That is, the carboxylic acid-terminated urethane imide oligomer is an oligomer having a urethane structure in a molecular chain, and closed imide group and at least one carboxy group at one or both terminals.

The carboxylic acid-terminated urethane imide oligomer contains, for example, a structural unit represented by the following general formula (4).

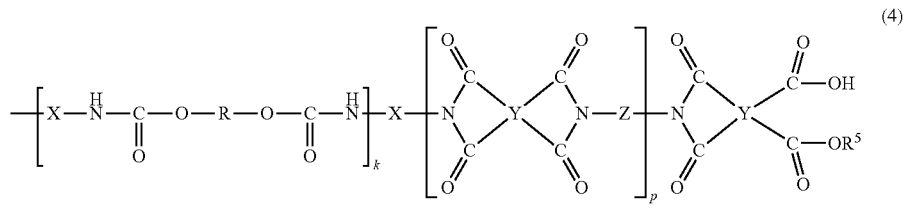

(4)

In the general formula (4), p is an integer of 0 or more, X, R and k are the same as in the general formula (2), and Y and $R^5$ are the same as in the general formula (3). When p is 0, the terminal structure of the general formula (3) is directly bonded to a terminal of the urethane structural unit of the general formula (2).

A carboxylic acid-terminated urethane imide oligomer in which the terminal structure of the general formula (3) is directly bonded to both terminals of the urethane structural unit of the general formula (2), i.e., a compound having a structure of the general formula (4), where p is 0, at both terminals is represented by the following general formula (5).

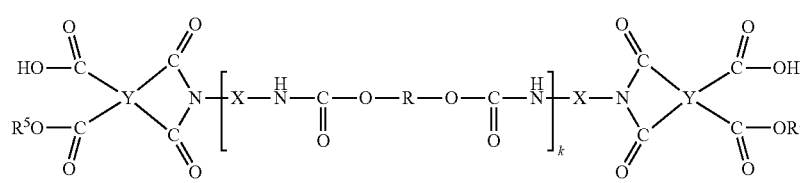

(5)

The carboxylic acid-terminated urethane imide oligomer having a urethane structure represented by the general formula (2) and a terminal structure represented by the general formula (3) is obtained by, for example, reacting an isocyanate-terminated urethane oligomer with a tetracarboxylic dianhydride to synthesize an acid anhydride-terminated urethane imide oligomer, and reacting water and/or alcohol to open a carboxylic acid anhydride group at the terminal.

(Isocyanate-Terminated Urethane Oligomer)

The isocyanate-terminated urethane oligomer (urethane prepolymer) is obtained by reacting a diol compound and a diisocyanate compound at a ratio such that the diisocyanate compound is excessive.

The diol compound is represented by the general formula $R(OH)_2$. R is a divalent organic group. Specific examples of the diol compound include alkylene diols such as ethylene glycol, diethylene glycol, propylene glycol, 1,3-butanediol, 1,4-butanediol, 1,5-pentanediol, neopentyl glycol, 3-methyl-1,5-pentanediol, 1,6-hexanediol, 1,8-octanediol, 2-methyl-1,8-octanediol, 1,9-nonanediol, 1,10-decanediol, 1,4-cyclohexanediol and 1,4-cyclohexanedimethanol; carboxy group-containing diols such as dimethylolpropionic acid (2,2-bis (hydroxymethyl)propionic acid), dimethylolbutanoic acid (2,2-bis(hydroxymethyl)butanoic acid), 2,3-dihydroxybenzoic acid, 2,4-dihydroxybenzoic acid, 2,5-dihydroxybenzoic acid, 2,6-dihydroxybenzoic acid, 3,4-dihydroxybenzoic acid and 3,5-dihydroxybenzoic acid; polyoxyalkylene diols such as polyethylene glycol, polypropylene glycol, polytetramethylene glycol, and random copolymers of tetramethylene glycol and neopentyl glycol; polyester diols obtained by reacting a polyhydric alcohol with a polybasic acid; polycarbonate diols having a carbonate backbone; polycaprolactone diols obtained by ring-opening addition reaction of a lactone such as γ-butyl lactone, ε-caprolactone or δ-valerolactone; and bisphenol A, ethylene oxide adducts of bisphenol A, propylene oxide adducts of bisphenol A, hydrogenated bisphenol A, ethylene oxide adducts of hydrogenated bisphenol A, and propylene oxide adducts of hydrogenated bisphenol A.

Use of a polycarbonate diol as the diol compound tends to improve the flexibility of the thermosetting resin composition (thermosetting resin film), embeddability between wirings, and adhesiveness between a conductor metal and an organic insulating layer. The polycarbonate diol is represented by the following general formula (6).

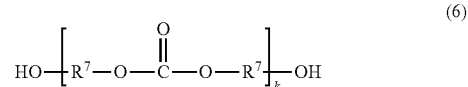

(6)

In the general formula (6), $R^7$ is a divalent organic group, and k is an integer of 1 or more, preferably 20 or less. Examples of commercially available products of the polycarbonate diol include "DURANOL" series manufactured by Asahi Kasei Corporation, "PLACCEL" CD series manufactured by Daicel Chemical Industries Ltd., "Kuraray Polyol" C series manufactured by KURARAY CO., LTD, and "NIPPOLAN" 900 series manufactured by TOSOH CORPORATION. From the viewpoint of adjusting the molecular weight of the urethane imide oligomer to an appropriate range, the number average molecular weight of the polycarbonate diol in terms of polystyrene may be 750 to 5,000, or 800 to 2,500.

By using a carboxy group-containing diol as the diol compound, a carboxy group can also be introduced into the side chain of the carboxylic acid-terminated urethane imide oligomer. As the diol compound, a polycarbonate diol and a carboxy group-containing diol may be used in combination. Use of a polycarbonate diol and a carboxy group-containing diol in combination tends to reduce the crystallinity of the carboxylic acid-terminated urethane imide oligomer, resulting in improvement of solubility, and to improve the heat resistance of the thermally cured film.

The diisocyanate compound is a compound of the general formula $X(NCO)_2$. X is a divalent organic group, and may be aromatic or aliphatic.

Specific examples of the diisocyanate compound include aromatic diisocyanate compounds such as diphenylmethane-2,4'-diisocyanate, 3,2'-, 3,3'-, 4,2'-, 4,3'-, 5,2'-, 5,3'-, 6,2'- or 6,3'-dimethyldiphenylmethane-2,4'-diisocyanate, 3,2'-, 3,3'-, 4,2'-, 4,3'-, 5,2'-, 5,3'-, 6,2'- or 6,3'-diethyldiphenylmethane-2,4'-diisocyanate, 3,2'-, 3,3'-, 4,2'-, 4,3'-, 5,2'-, 5,3'-, 6,2'- or 6,3'-dimethoxydiphenylmethane-2,4'-diisocyanate, diphenylmethane-4,4'-diisocyanate, diphenylmethane-3,3'-diisocyanate, diphenylmethane-3,4'-diisocyanate, diphenyl4'-diisocyanate, benzophenone-4,4'-diisocyanate, diphenylsulfone-4,4'-diisocyanate, tolylene-2,4-diisocyanate, tolylene-2,6-diisocyanate, m-xylylene diisocyanate, p-xylylene diisocyanate, naphthalene-2,6-diisocyanate and 4,4'-[2,2-bis(4-phenoxyphenyl)propane]diisocyanate; alicyclic diisocyanate compounds such as hydrogenated diphenylmethane diisocyanate, hydrogenated xylylene diisocyanate, isophorone diisocyanate and norbornene diisocyanate; and aliphatic diisocyanate compounds such as hexamethylene diisocyanate, trimethylhexamethylene diisocyanate and lysine diisocyanate. As the isocyanate compound, a blocked isocyanate may be used in which an isocyanate group is blocked with a protecting group such as an alcohol, a phenol, a lactam or an oxime.

Among the diisocyanate compounds exemplified above, diphenylmethane-4,4'-diisocyanate, diphenylmethane-3,3'-diisocyanate, diphenylmethane-3,4'-diisocyanate, tolylene-2,4-diisocyanate, tolylene-2,6-diisocyanate and norbornene diisocyanate are particularly preferable from the viewpoint of improving the heat resistance of the thermally cured film.

(Preparation of Isocyanate-Terminated Urethane Oligomer)

A urethane oligomer having an isocyanate group at a terminal is obtained by reacting a diol compound and a diisocyanate compound at a ratio such that the diisocyanate compound is excessive. The ratio of the diol compound and the diisocyanate compound may be such that the ratio of the number of isocyanate groups to the number of hydroxy groups (isocyanate groups/hydroxy groups) is larger than 1. The ratio of isocyanate groups/hydroxy groups may be 1.1 to 2.0, 1.15 to 1.8, or 1.2 to 1.6. When the ratio of isocyanate groups/hydroxy groups is 1 or less, the ratio of isocyanate at a terminal is lower. When the ratio of isocyanate groups/hydroxy groups is large, the reaction does not proceed any more when the diisocyanate is bonded to both terminals of one molecule of the diol. Therefore, the molecular weight of the oligomer does not increase, and thus the heat resistance and strength of the thermally cured film may be insufficient.

When two or more diol compounds are used, the reaction with the diisocyanate compound may be carried out after two or more diol compounds are mixed, or each diol compound and the diisocyanate compound may be separately reacted. After the diol compound and the diisocyanate compound are reacted, the resulting isocyanate-terminated compound may be reacted with another diol compound, followed by further reacting the reaction product with the diisocyanate compound. The same applies to a case where two or more types of diisocyanate compounds are used.

The reaction temperature of the diol and the diisocyanate may be 40 to 160° C., or 60 to 150° C. When the temperature is lower than 40° C., the reaction time increases, and when the temperature is higher than 160° C., a three-dimensional reaction easily occurs during the reaction, leading to gelation. The reaction time may be appropriately adjusted. If necessary, the reaction may be carried out in the presence of a catalyst such as a tertiary amine, a metal such as an alkali metal, an alkaline earth metal, tin, zinc, titanium, or cobalt, or a metalloid compound.

The diol and the diisocyanate react even in the absence of a solvent, but may be reacted in an organic solvent from the viewpoint of reaction control. As the organic solvent, one capable of dissolving a diol and a diisocyanate and capable of dissolving a urethane oligomer obtained by the reaction can be used without particular limitation. It is preferable that the amount of the solvent is adjusted so that the solute concentration in the reaction solution is 5 to 90 wt %. The solute concentration in the reaction solution may be 10 to 80 wt % or less.

In the isocyanate-terminated urethane oligomer, the isocyanate group at a terminal may be blocked with a protecting group such as an alcohol, a lactam or an oxime.

(Terminal Modification with Tetracarboxylic Dianhydride)

By a decarbonation imidization reaction between an isocyanate-terminated urethane oligomer and a tetracarboxylic dianhydride, a urethane imide oligomer having an imide group and an acid anhydride group at a terminal is obtained. The tetracarboxylic dianhydride is represented by the following general formula (7). The urethane imide oligomer produced by reaction of a tetracarboxylic dianhydride with both terminals of an isocyanate-terminated urethane oligomer is represented by the following general formula (8).

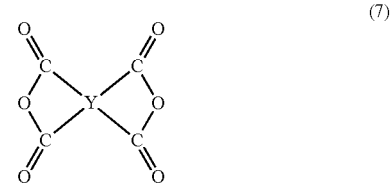
(7)

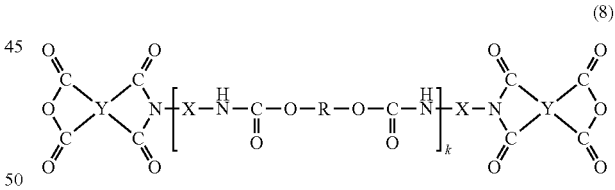
(8)

In the general formulae (7) and (8), Y is a tetravalent organic group, which is a tetracarboxylic dianhydride residue. The acid anhydride-terminated urethane imide oligomer may have an acid anhydride group at one or both terminals. The acid anhydride-terminated urethane imide oligomer may contain an imide bond not only at the terminal but also in the molecular chain (part other than the terminal). For example, an isocyanate-terminated urethane imide oligomer reacts with the acid dianhydride at one or both terminals of the compound of the general formula (8) to form a molecular chain having an imide bond in the molecular chain. Further, a tetracarboxylic dianhydride is bonded to the isocyanate at the terminal to introduce an imide group and an acid anhydride group to the terminal.

Examples of the tetracarboxylic dianhydride include 3,3', 4,4'-benzophenonetetracarboxylic dianhydride, pyromellitic dianhydride, 3,3',4,4'-oxydiphthalic dianhydride, 2,2-bis[4-(3,4-dicarboxyphenoxy)phenyl]propane dianhydride, 2,2-bis(4-hydroxyphenyl)propane dibenzoate-3,3',4,4'-tetracarboxylic dianhydride, 3,3',4,4'-diphenylsulfonetetracarboxylic dianhydride, 3,3',4,4'-biphenyltetracarboxylic dianhydride, 2,3,3',4-biphenyltetracarboxylic dianhydride, and 5-(2,5-oxotetrahydro-3-furanyl)-3-methyl-3-cyclohexene-1,2-dicarboxylic anhydride.

Among the tetracarboxylic dianhydrides exemplified above, 2,2-bis[4-(3,4-dicarboxyphenoxy)phenyl]propane dianhydride, 3,3',4,4'-diphenylsulfonetetracarboxylic dianhydride, and 3,3',4,4'-oxydiphthalic acid dianhydride are preferable from the viewpoint of improving the solubility of the carboxylic acid-terminated urethane imide oligomer in an organic solvent and improving the heat resistance of the thermally cured film. Among them, from the viewpoint of compatibility with other materials in the thermosetting resin composition, 2,2-bis[4-(3,4-dicarboxyphenoxy)phenyl]propane dianhydride or 5-(2,5-dioxotetrahydro-3-furanyl)-3-methyl-3-cyclohexene-1,2-dicarboxylic anhydride is preferable.

In the reaction between the isocyanate-terminated urethane oligomer and the tetracarboxylic dianhydride, the molar ratio of acid dianhydride groups to isocyanate groups (acid dianhydride groups/isocyanate groups) may be more than 1 and 2.10 or less. When the ratio of acid dianhydride groups/isocyanate groups is more than 1, it is easy to obtain a compound in which a urethane oligomer is modified at both terminals with a tetracarboxylic dianhydride. When the ratio of acid dianhydride groups/isocyanate groups is 2.1 or less, the residual amount of an unreacted tetracarboxylic anhydride can be reduced. The ratio of acid dianhydride groups/isocyanate groups may be 1.1 to 2.1, or 1.9 to 2.1.

It is preferable that the reaction between the isocyanate-terminated urethane oligomer and the tetracarboxylic dianhydride is carried out in an organic solvent. The solvent used for preparing the isocyanate-terminated urethane oligomer may be used as it is, or a solvent may be further added for the purpose of, for example, adjusting the solid content concentration.

The reaction between the isocyanate-terminated urethane oligomer and the tetracarboxylic dianhydride is not particularly limited as long as an isocyanate group at the terminal of the urethane oligomer and an acid anhydride group of the tetracarboxylic dianhydride can form an imide bond through decarboxylation. Examples of typical methods include the following methods 1 to 3.

Method 1: A solution obtained by dispersing or dissolving a tetracarboxylic dianhydride in an organic solvent is heated to 100 to 300° C., and an isocyanate-terminated urethane oligomer is added thereto. It is preferable that under heating, decarbonation imidization proceeds with the reaction starting substantially simultaneously with addition of the isocyanate-terminated urethane oligomer. The heating temperature may be 140 to 250° C.

Method 2: The isocyanate-terminated urethane oligomer and the tetracarboxylic dianhydride are mixed and completely dissolved at a low temperature (e.g. lower than 100° C.), followed by performing decarbonation imidization at a solution temperature of 100 to 300° C., or 140 to 250° C.

Method 3: An isocyanate-terminated compound is gradually added to and dissolved in a solution obtained by dispersing or dissolving a tetracarboxylic dianhydride in an organic solvent. The solution in which the compound is uniformly dissolved is heated to 100 to 250° C., or 140 to 250° C. and simultaneously decompressed to perform decarbonation imidization.

(Opening of Acid Anhydride Group)

A urethane imide oligomer having an acid dianhydride group at a terminal is reacted with water and/or an alcohol to open the acid dianhydride, thereby obtaining a urethane imide oligomer having a terminal structure of the general formula (3). When water is used, $R^1$ in the general formula (3) is a hydrogen atom, and the terminal structure is a dicarboxylic acid structure. When an alcohol is used, $R^1$ in the general formula (3) is an alkyl group, and the terminal structure is a half-ester structure.

As the alcohol, a primary alcohol or a secondary alcohol is used, and the number of carbon atoms in the alkyl group may be 1 to 4. Specific examples of the alcohol include methanol, ethanol, propanol, butanol and isopropanol.

For the reaction of the acid anhydride-terminated urethane imide oligomer with water and/or an alcohol, for example, water and/or an alcohol may be added to the acid anhydride urethane-terminated imide oligomer in a molar amount 2 to 300 times, or 2 to 200 times the molar amount of tetracarboxylic acid dianhydride used for terminal modification.

In the reaction, it is preferable that heating is performed without volatilization of the added water and/or alcohol to the outside of the reaction system, and the reaction temperature may be 20 to 150° C., or 30 to 120° C. From the viewpoint of reaction acceleration, the addition amount of water and/or an alcohol may be large, but if the addition amount is excessively large, solubility of other resin components may be reduced due to the influence of water and/or alcohol remaining in the solution. Thus, it is preferable to remove unreacted substances after the reaction.

(Modification with Imide Oligomer)

Although an isocyanate-terminated urethane oligomer is imidized at a terminal using a tetracarboxylic acid dianhydride in the example described above, terminal modification may be performed with an imide oligomer having an acid anhydride group at both terminals. The imide oligomer having an acid anhydride group at both terminals has a structure represented by the following general formula (9).

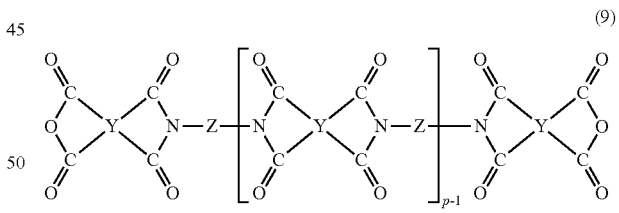

(9)

In the general formula (9), Y is a tetravalent organic group, which is a tetracarboxylic dianhydride residue. Z is a divalent organic group, and is a diamine residue or a diisocyanate residue. p is an integer of 1 or more, or 20 or less, and may be 15 or less or 10 or less. If p is excessively large, the solubility of the imide oligomer in an organic solvent and flexibility of the film may be deteriorated.

The imide oligomer having an acid anhydride group at both terminals, which is represented by the general formula (9), can be prepared by, for example, reacting a diamine with a tetracarboxylic acid dianhydride to prepare a polyamic acid oligomer, and imidizing the polyamic acid oligomer by heating. As the tetracarboxylic dianhydride, for example, those described above are suitably used. As the diamine, various diamines used for preparation of the polyimide can be used without particular limitation.

The ratio of tetracarboxylic dianhydride to diamine (tetracarboxylic dianhydride/diamine) may be 1.1 to 2.1, or 1.2 to 2.0. As the ratio of tetracarboxylic dianhydride/diamine is closer to 1, p tends to increase, and p tends to decrease as the ratio of tetracarboxylic dianhydride/diamine increases. When the ratio of tetracarboxylic dianhydride/diamine is more than 2, p becomes closer to 1.

The imide oligomer having an acid anhydride group at both terminals can also be prepared by reaction of a tetracarboxylic acid dianhydride with a diisocyanate.

An acid anhydride-terminated urethane imide oligomer is prepared by reacting the isocyanate-terminated urethane oligomer with the imide oligomer having an acid anhydride group at both terminals, and then reacted with water and/or an alcohol to open an acid dianhydride group, thereby obtaining a urethane imide oligomer having a structure of the general formula (4) (where p is an integer of 1 or more).

<(B) Oxazoline Group-Containing Polymer>

The oxazoline group-containing polymer as the component (B) has a repeating unit represented by the following general formula (1).

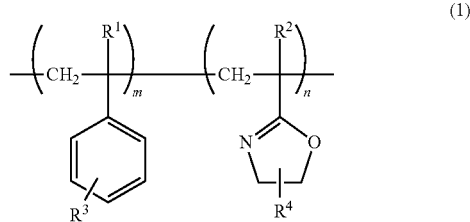

(1)

$R^1$ and $R^2$ in the general formula (1) are each independently a hydrogen atom or a methyl group. $R^3$ is a hydrogen atom or any substituent, and a plurality of $R^3$s may be bonded to form a ring structure. The structure formed by bonding a plurality of $R^3$s may be an aromatic ring. $R^4$ is a hydrogen atom or an alkyl group. In the general formula (1), a block structure is described for convenience, but oxazoline group-containing units and aromatic ring-containing units may be randomly arranged.

The oxazoline group-containing unit in the general formula (1) reacts with the carboxy group of the component (A) and therefore contributes to thermal curing. The aromatic ring-containing unit in the general formula (1) contributes to reduction of the dielectric constant and reduction of the dielectric loss tangent of the thermally cured film. The relative dielectric constant and the dielectric loss tangent of the thermally cured film tend to decrease as m/n increases (i.e., the ratio of the aromatic ring-containing unit becomes higher).

Improvement of the heat resistance of the thermally cured film as well as reduction of the residual amount of carboxy groups in the film by reaction of the oxazoline group with the carboxy groups of the component (A) and the component (C) described later also contributes to reduction of the dielectric constant and reduction of the dielectric loss tangent. In the reaction between the epoxy group and the carboxy group, a hydroxy group is generated, whereas in the reaction between the oxazoline group and the carboxy group, a hydroxy group is not generated. Therefore, a thermally cured product obtained by reaction of the oxazoline group-containing compound with the carboxy group-containing compound has a small polymer polarizability, and is effective for reducing the dielectric constant.

From the viewpoint of reduction of the low dielectric constant and reduction of the dielectric loss tangent, m/n in the general formula (1) may be 1 or more, 5 or more, 10 or more, 15 or more, 20 or more, or 25 or more. The relative dielectric constant and the dielectric loss tangent of the thermally cured film tend to decrease as m/n becomes larger. On the other hand, if m/n is excessively large, thermal curing may be insufficient, or the amount of residual carboxy groups may increase, resulting in an increase in dielectric constant. Thus, m/n may be 50 or less, 45 or less, 40 or less, 35 or less, or 30 or less.

The polymer represented by the general formula (1) is obtained by copolymerization of a polymerizable compound containing an aromatic ring and a polymerizable compound containing an oxazoline group. When a compound having a vinyl group as a polymerizable functional group is used, the substituents $R^1$ and $R^2$ at the α-position are hydrogen atoms, and when a compound having an isopropenyl group as a polymerizable functional group is used, the substituents $R^1$ and $R^2$ at the α-position are methyl groups.

Examples of the polymerizable compound containing an aromatic ring include styrene, α-methylstyrene, 1-vinylnaphthalene, 2-vinylnaphthalene, 1-isopropenylnaphthalene and 2-isopropenylnaphthalene. Examples of the polymerization unit containing an oxazoline group include 2-vinyl-2-oxazoline, 2-vinyl-4-methyl-2-oxazoline, 2-vinyl-5-methyl-2-oxazoline, 2-isopropenyl-2-oxazoline, 2-isopropenyl-4-methyl-2-oxazoline and 2-isopropenyl-5-ethyl-2-oxazoline.

For example, when styrene is used as the polymerizable compound containing an aromatic ring, and 2-isopropenyl-2-oxazoline is used as the polymerizable compound containing an oxazoline group, a polymer having a structure represented by the following formula is obtained.

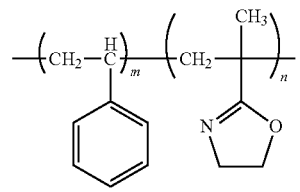

The weight average molecular weight of the oxazoline group-containing polymer is, for example, 10,000 to 500,000. From the viewpoint of the solubility of the polymer in an organic solvent and the tackiness of a coating film of the thermosetting resin composition, the weight average molecular weight of the oxazoline group-containing polymer may be 30,000 to 400,000, 50,000 to 300,000, 70,000 to 250,000 or 100,000 to 200,000.

The amount of the component (B) in the thermosetting resin composition may be 50 to 7000 parts by mass, 100 to 3000 parts by mass, 130 to 1000 parts by mass, 150 to 700 parts by mass or 170 to 500 parts by mass based on 100 parts by mass of the solid content of the component (A), from the viewpoint of reduction of dielectric constant and reduction of the dielectric loss tangent of the thermally cured film, and heat resistance.

It is preferable that the amount of the component (B) in the thermosetting resin composition is adjusted such that the ratio of the amount of oxazoline groups in the component (B) to the total amount of carboxy groups (carboxy groups/ oxazoline groups) in the composition is 0.1 to 3.0. The amount of carboxy groups in the composition is the amount of carboxy groups contained in the component (A), and when the composition contains the following component (C), the amount of carboxy groups in the composition is the sum of the amount of carboxy groups contained in the component (A) and the amount of carboxy groups contained in the component (C).

When the ratio of carboxy groups/oxazoline groups is excessively large, the relative dielectric constant and the dielectric loss tangent tend to increase because thermally cured film has a large amount of residual carboxy groups. On the other hand, when the ratio of carboxy groups/oxazoline groups is excessively small, insufficient curing or deterioration of heat resistance may occur because the number of crosslinking points is small, etc. The ratio of carboxy groups/oxazoline groups in the thermosetting resin composition may be 0.3 to 2.5, 0.5 to 2.0, 0.7 to 1.8 or 0.9 to 1.6.

<(C) Carboxy Group-Containing Compound>

The thermosetting resin composition may contain, as a component (C), a carboxy group-containing compound other than the component (A). The component (C), as well as the component (A), contributes to thermal curing by reacting with the oxazoline group of the component (B).

From the viewpoint of achieving the flexibility of the film, the embeddability of the film between wirings, and the heat resistance of the thermally cured film, the weight average molecular weight of the component (C) in terms of polyethylene glycol may be 1,000 to 30,000, 2,000 to 25,000, 3,000 to 20,000 or 5,000 to 15,000. The imide oligomer may have two or more imide groups per molecule. The acid value of the component (C) may be 3 to 200 mg KOH/g, 5 to 100 mg KOH/g, 7 to 70 mg KOH/g or 10 to 50 mg KOH/g. From the viewpoint of improving the embeddability of resin between wirings, the acid value of the component (C) may be smaller than the acid value of the component (A). The acid value of the component (C) may be 0.05 to 0.8 times, 0.1 to 0.7 times or 0.15 to 0.6 times the acid value of the component (A).

The component (C) may have a carboxy group at a side chain, a carboxy group at a terminal, or a carboxy group on both the side chain and the terminal. From the viewpoint of enhancing the embeddability of resin between wirings, the component (C) may be one that has a carboxy group at a side chain and does not have a carboxy group at a terminal.

As in the component (A), the carboxy group of the component (C) reacts with the oxazoline group of the component (B). When the component (C) does not have a carboxy group at a terminal, the terminal of the component (C) does not react during heating for thermal curing, and thus the mobility of the molecular chain is secured. Thus, the component (C) acts like a plasticizer to lower the apparent glass transition temperature, so that the resin composition has high fluidity even at a low temperature, and this is considered as one factor of improving embeddability between wirings.

The component (C) may have an ethylenically unsaturated group in addition to a carboxy group. Examples of the ethylenically unsaturated group include a (meth)acryloyl group and a vinyl group. In the present disclosure, the "(meth)acryl" means acryl or methacryl, and the "(meth) acryloyl" means acryloyl or methacryloyl.

When the component has an ethylenically unsaturated group at a terminal, the wiring embeddability of the thermally cured film tends to be improved. In particular, when a compound having ethylenically unsaturated groups at both terminals is used as the component (C), wiring embeddability tends to be improved. The ethylenically unsaturated group may be a (meth)acryloyl group.

Specific examples of the component (C) include acid-modified epoxy (meth)acrylates obtained by adding a saturated or unsaturated polycarboxylic anhydride to an ester obtained by reacting an epoxy resin with an unsaturated monocarboxylic acid; urethane (meth)acrylates as polymerized products of a diol compound having an ethylenically unsaturated group and/or a carboxy group and a diisocyanate compound; and (meth)acrylated (meth) acrylates obtained by reacting a part of a carboxy group at a side chain of a copolymer of (meth)acrylic acid having a carboxy group and a polymerizable double bond and a (meth)acrylate with an epoxy group of a compound having a (meth)acrylic group and an epoxy group, such as glycidyl (meth)acrylate.

Examples of commercially available products of the epoxy (meth)acrylate having a carboxy group include KAYARAD ZFR series, ZAR series, ZCR series, CCR series, PCR series and UXE series each manufactured by Nippon Kayaku Co., Ltd. Examples of commercially available products of the urethane (meth)acrylate having a carboxy group include UX series manufactured by Nippon Kayaku Co., Ltd. Examples of commercially available products of the (meth)acrylated (meth)acrylate include CYCLOMER ACA series manufactured by Daicel allnex Ltd. From the viewpoint of improving wiring embeddability and adhesiveness, urethane (meth)acrylate is particularly preferable as the component (C).

When the thermosetting resin composition contains the component (C), the amount of the component (C) may be 0.5 parts by mass or more, 1 part by mass or more, 3 parts by mass or more or 5 parts by mass or more, based on 100 parts by mass of the solid content of the component (A), from the viewpoint of improving wiring embeddability. On the other hand, from the viewpoint of reduction of dielectric constant and reduction of the dielectric loss tangent of the thermally cured film, adhesiveness, heat resistance and the like, the amount of the component (C) may be 100 parts by mass or less, 50 parts by mass or less, 30 parts by mass or less, 25 parts by mass or less or 20 parts by mass or less, based on 100 parts by mass of the solid content of the component (A).

(Photopolymerization Initiator)

Ethylenically unsaturated groups such as (meth)acryloyl groups and vinyl groups have radical or cationic reactivity under light or heat. The component (C) contributes to thermal curing due to reaction of the carboxy group with the oxazoline group of the component (B). Thus, even when the component (C) contains an ethylenically unsaturated group, the ethylenically unsaturated group is not required to contribute to the curing reaction. Rather, when the ethylenically unsaturated group of the component (C) is involved in a curing reaction under light or heat, flexibility may be lost, leading to deterioration of adhesiveness and wiring embeddability. From the viewpoint of the storage stability, adhesiveness and wiring embeddability of the composition, the thermosetting resin composition may be substantially free of a photopolymerization initiator and a thermal polymerization initiator.

The thermosetting resin composition is cured by heating, and therefore is not required to contain a photopolymerization initiator for photocuring. When the thermosetting resin composition is substantially free of a photopolymerization initiator, it is possible to suppress a reaction of the ethylenically unsaturated group which is caused by light in a storage environment (e.g. an ultraviolet ray from a fluorescent lamp), so that the storage stability of the thermosetting resin composition can be improved. In addition, when photocuring is not performed after thermal curing of the resin composition, a part or all of the ethylenically unsaturated group of the component (C) remains unreacted, so that the flexibility of the film is secured.

In the thermosetting resin composition, a small amount of the photopolymerization initiator used for the polymerization of the components (A) to (C) and the component (D) described later may remain, and from the viewpoint of the storage stability of the composition and the flexibility of the film, the amount of the photopolymerization initiator in the composition may be small. Specifically, the content of the photopolymerization initiator based on 100 parts by mass of the total solid content of the thermosetting resin composition may be less than 0.05 parts by mass, less than 0.01 parts by mass, less than 0.001 parts by mass, less than 0.0005 parts by mass, less than 0.0001 parts by mass, or 0.

The thermosetting resin composition may be substantially free of a thermal polymerization initiator which promotes thermal curing of the ethylenically unsaturated group, such as a thermal radical initiator or a thermal cationic initiator. In a cured film obtained by thermal curing of a resin composition substantially free of a thermal polymerization initiator, shrinkage on curing by heating in bonding to a conductor layer (circuit pattern) or an organic insulating layer is unlikely to occur, so that warpage of the board tends to be suppressed. In addition, when the thermosetting resin composition is substantially free of a thermal polymerization initiator, it is possible to suppress a reaction of the ethylenically unsaturated group which is caused by heat in a storage environment, so that the storage stability of the thermosetting resin composition can be improved.

In general, a thermosetting resin composition containing a (meth)acryloyl group-containing compound contains a thermal polymerization initiator, and accelerates radicalization or cationization of a (meth)acryloyl group to increase the rate of curing by heating. On the other hand, in the thermosetting resin composition of one or more embodiments, the carboxy groups of the components (A) and (C) react with the oxazoline group of the component (B), so that curing proceeds. Thus, even when a thermal polymerization initiator is not contained in the composition, and the reaction of radicalization or cationization of the ethylenically unsaturated group of the component (C) does not proceed, the composition is thermally cured.

In general, when a thermal polymerization initiator such as a peroxide is not present, the rate of reaction of an ethylenically unsaturated group such as a (meth) acryloyl group under thermal energy is lower than the rate of reaction of the carboxy groups of the component (A) and component (C) with the oxazoline group of the component (B). Thus, when the thermosetting resin composition is substantially free of a thermal polymerization initiator, the reaction of the carboxy group of the component (C) is made to preferentially proceed by heating, and a part or all of the ethylenically unsaturated group of the component (C) remains unreacted during thermal curing, resulting in high fluidity, which can contribute to improvement of embeddability of the resin between wirings.

In the thermosetting resin composition, a small amount of the thermal polymerization initiator used for the polymerization of the components (A) to (C) and the component (D) described later may remain, and from the viewpoint of the storage stability of the composition and the wiring embeddability of the film, the amount of the thermal polymerization initiator in the composition may be small. Specifically, the content of the thermal polymerization initiator based on 100 parts by mass of the total solid content of the thermosetting resin composition may be less than 0.05 parts by mass, less than 0.01 parts by mass, less than 0.001 parts by mass, less than 0.0005 parts by mass, less than 0.0001 parts by mass, or 0.

<(D) Compound Reactive with Carboxy Group>

As described above, the thermosetting resin composition is thermally cured because the oxazoline group of the component (B) reacts with the carboxy groups of the component (A) (and the component (C)). The thermosetting resin composition may contain a compound having reactivity with a carboxy group in addition to the component (B).

For example, an epoxy resin may be contained as the component (D). The epoxy resin has reactivity with a carboxy group, and is therefore involved in a thermal curing reaction. When the thermosetting resin composition contains an epoxy resin as the component (D), the heat resistance and electrical insulation reliability of the thermally cured film may be improved.

The epoxy resin is a resin having at least one epoxy group in the molecule, and may contain two or more epoxy groups from the viewpoint of improving the heat resistance and electrical insulation reliability of the cured film. Examples of the epoxy resin include bisphenol A-type epoxy resins, bisphenol F-type epoxy resins, bisphenol S-type epoxy resins, hydrogenated bisphenol A-type epoxy resins, biphenyl-type epoxy resins, phenoxy-type epoxy resins, naphthalene-type epoxy resins, phenol novolac-type epoxy resins, cresol novolac-type epoxy resins, trisphenol methane-type epoxy resins, dicyclopentadiene-type epoxy resins and amine-type epoxy resins. The epoxy resin may be an epoxy resin modified with urethane, rubber, a chelate, a dimer acid or the like. As the component (D), a commercially available epoxy resin may be used.

As described above, when the epoxy group reacts with the carboxy group, a hydroxy group is generated, and therefore the thermally cured film tends to have a higher dielectric constant as compared to a case where the oxazoline group reacts with the carboxylic group. From the viewpoint of reduction of the dielectric constant of the thermally cured film, the content of the epoxy resin in the thermosetting resin composition may be small. The content of the epoxy resin in the thermosetting resin composition may be 100 parts by mass or less, 50 parts by mass or less, 30 parts by mass or less, 15 parts by mass or less, 10 parts by mass or less or 5 parts by mass or less, based on 100 parts by mass of the solid content of the component (A). From the viewpoint of reduction of the dielectric constant, the thermosetting resin composition may be free of an epoxy resin. On the other hand, from the viewpoint of improving the heat resistance and electrical insulation reliability of the cured film, the thermosetting resin composition may contain 1 part by mass or more, 3 parts by mass or more, or 5 parts by mass or more of the epoxy resin based on 100 parts by mass of the solid content of the component (A).

The content of the epoxy resin in the thermosetting resin composition may be 50 parts by mass or less, 30 parts by mass or less, 20 parts by mass or less, 15 parts by mass or less, 10 parts by mass or less, or 5 parts by mass or less, based on 100 parts by mass of the solid content of the component (B). The ratio of the amount of epoxy groups to the amount of oxazoline groups (epoxy groups/oxazoline groups) in the component (B) in the thermosetting resin composition may be 2 or less, 1 or less, 0.5 or less, 0.3 or less, 0.1 or less, or 0.05 or less.

When the amount of the epoxy group with respect to the content of the component (B) (the amount of the oxazoline group) is relatively small, the dielectric constant of the thermally cured film tends to decrease because the ratio of the carboxy group that reacts with the oxazoline group during thermal curing increases. The ratio of the amount of epoxy groups to the total amount of carboxy groups (epoxy groups/carboxy groups) in the thermosetting resin composition may be less than 1, 0.7 or less, 0.5 or less, 0.3 or less, 0.1 or less, or 0.05 or less.

<Other Components (E)>

The thermosetting resin composition of one or more embodiments may contain solid contents other than the components (A) to (D). The other component may be a resin component other than the components (A) to (D), and may be heat-curable. From the viewpoint of reduction of the dielectric constant and reduction of the dielectric loss tangent of the thermally cured film, the content of the resin components other than (A) to (D) may be small. The amount of the resin components other than the components (A) to (D) may be 100 parts by mass or less, 50 parts by mass or less, 30 parts by mass or less, 20 parts by mass or less, 10 parts by mass or less, or 5 parts by mass or less, based on 100 parts by mass of the total of the components (A) to (D).

The thermosetting resin composition of one or more embodiments may contain fine particles. Examples of the fine particles include inorganic fillers, flexibility imparting agents and flame retardants. When the thermosetting resin film contains fine particles, it is possible to control the fluidity of the thermosetting resin composition, improve the heat resistance and flame retardancy, improve the insulation reliability and reduce the linear expansion coefficient of the thermally cured film, and so on.

Examples of the material for the inorganic filler include nonmetallic inorganic fillers such as alumina, aluminum hydroxide, magnesium hydroxide, calcium carbonate, magnesium carbonate, calcium silicate, magnesium silicate, calcium oxide, magnesium oxide, aluminum oxide, aluminum nitride, crystalline silica, amorphous silica, boron nitride, titania, glass, iron oxide and ceramics.

Examples of the material for the flexibility imparting agent include various synthetic rubbers such as acrylic rubber, acrylonitrile butadiene rubber and carboxy-containing acrylonitrile butadiene rubber, rubber-modified high-molecular-weight compounds, modified polyimides, modified polyamideimides, polyurethane resins, polyester resins, polyurethane polyester resins, polyvinyl butyral resins, polyvinyl acetoacetal resins, and phenoxy resins.

Examples of the material for the flame retardant include phosphorus atom-containing compounds, nitrogen atom-containing compounds and inorganic flame retardant compounds. To be more specific, examples of the material include phosphoric acid esters such as trimethyl phosphate, triethyl phosphate, tributyl phosphate, tri-2-ethylhexyl phosphate, tributoxyethyl phosphate, triphenyl phosphate, tricresyl phosphate, trixylenyl phosphate, cresyl diphenyl phosphate, xylenyl diphenyl phosphate, 2-ethylhexyl diphenyl phosphate, tris(2,6-dimethylphenyl) phosphate and resorcin diphenyl phosphate; condensed phosphoric acid ester compounds such as ammonium polyphosphate, polyphosphoric amide, red phosphorus, guanidine phosphate and dialkyl hydroxymethyl phosphonate; nitrogen atom-containing compounds such as melamine; inorganic flame retardant compounds such as aluminum hydroxide, magnesium hydroxide, zinc borate and calcium borate.

The average particle diameter of the fine particles may be 0.1 to 10 μm, or 0.1 to 5 μm. If the average particle diameter is more than 10 μm, fine particles may be likely to settle in the composition (solution), or a bonding failure may occur because the particle diameter exceeds the depth of a wiring circuit pattern. If the average particle diameter is less than 0.1 μm, fine particles may be likely to aggregate, resulting in deterioration of coatability due to an increase in viscosity of the solution of the thermosetting resin composition.

The amount of fine particles in the thermosetting resin composition may be 1 to 100 parts by mass, or 3 to 50 parts by mass, based on 100 parts by mass of the solid content of the component (A). The amount of the fine particles in the thermosetting resin composition may be 3 to 50 parts by mass, or 5 to 40 parts by mass, based on 100 parts by mass of the total solid content of the components (A) to (D). From the viewpoint of reduction of the dielectric constant and reduction of the dielectric loss tangent of the thermally cured film, the amount of fine particles based on 100 parts by mass of the total solid content of the components (A) to (D) may be 30 parts by mass or less, or 20 parts by mass or less.

The thermosetting resin composition may contain various additives such as an adhesive aid, an antifoaming agent, a leveling agent, a coloring agent and a polymerization inhibitor in addition to the above-described components. The contents of the additives may be appropriately set.

<Preparation of Thermosetting Resin Composition>

A thermosetting resin composition can be prepared by mixing the component (A) and the component (B), and the component (C), the component (D) and the component (E) if necessary. It is preferable to prepare the thermosetting resin composition by mixing the components (A) to (E) in an organic solvent. The organic solvent is not particularly limited as long as it can dissolve resin components. As the solvent for the thermosetting resin composition, the organic solvent used for preparing the components (A) to (E) may be used as it is.

It is preferable that the component (B) is dissolved in an organic solvent in advance, and mixed with other components. Examples of the organic solvent in which the component (B) is dissolved include diethylene glycol monoethyl ether acetate (also known as carbitol acetate), 2-methoxy-1-methylethyl acetate, methyl ethyl ketone, acetone, 1,3-dioxolane and toluene.

The order of mixing the components (A) to (E) is not particularly limited, and all the components may be mixed at a time. As a method for uniformly mixing the composition, a method using a kneading apparatus such as a three-roller mill or a bead mill is preferable. When the viscosity of the solution is low, mixing may be performed using a general stirrer.

[Thermosetting Resin Film (B-Stage Film)]

The thermosetting resin composition is applied onto a support substrate (carrier film), and the organic solvent is removed by heating or the like to obtain a thermosetting resin film (B-stage film). Although the thickness of the support substrate is not particularly limited, the thickness is generally about 10 to 150 μm. The support substrate may have a surface subjected to treatment such as MAD treatment, corona treatment, or release treatment.

As the support substrate, for example, a resin film is used. Examples of the material for the resin film include polyolefins such as polyethylene, polypropylene and polyvinyl chloride, polyesters such as polyethylene terephthalate and polyethylene naphthalate, polyimide and polycarbonate.

The support substrate may be a metal foil such as a copper foil or release paper. Use of a laminate, in which a thermosetting resin film is disposed on a copper foil, for a multi-layer printed wiring board is advantageous for thickness reduction and weight reduction because a resin film has both a role as an adhesive layer and a role as an insulating layer.

The thermosetting resin composition can be applied onto the support substrate by a known method such as comma coating, knife coating, die coating, lip coating, brush coating, dip coating, a roll coating, spray coating or curtain roll coating. The thickness of the coating film may be adjusted such that the B-stage film has a thickness of about 5 to 100 μm, or about 10 to 50 μm, after drying. When drying is performed by heating, the temperature may be 40 to 160° C., or 50 to 120° C., from the viewpoint of suppressing a thermal curing reaction.

A cover film (surface protective film) may be laminated on the surface of the B-stage film formed on the support substrate. As the cover film, various resin films, metal foils, release paper and the like are used as in the case of the support substrate.

[Bonding and Thermal Curing]

The thermosetting resin film (B-stage film) can be used as, for example, an interlayer adhesive layer in a printed wiring board. The resin film is excellent in embeddability of resin between wirings and excellent in heat resistance, chemical resistance, flexibility, smoothness, etc., and is therefore suitably used as an adhesive layer of a multilayer printed wiring board of build-up type, particularly a multilayer flexible printed wiring board.

A multilayer printed wiring board can be produced by laminating a thermosetting resin film (B-stage film) on a circuit wiring-formed surface of a circuit board having a patterned circuit wiring on a substrate, peeling off a support substrate, then laminating an organic insulating layer (e.g. a substrate film), a conductor, a circuit board and the like if necessary, and thermally curing the resin film. The thermally cured film obtained by thermally curing the thermosetting resin film functions as an interlayer adhesive layer. A resin composition may be applied onto a circuit board, an organic insulating layer or a conductor to form a coating film, dried if necessary to form a thermosetting resin film, and then thermally cured to form a thermally cured film.

The conditions for thermal curing are not particularly limited, and it is preferable to perform thermal curing at a low temperature in order to prevent oxidation of a conductor such as a wiring and prevent reduction of adhesion between the conductor and the organic insulating layer. The heating temperature may be 100 to 250° C., 120 to 220° C., 130 to 190° C., or 150 to 190° C. The heating time is not particularly limited, and is generally about 1 minute to 200 minutes. From the viewpoint of, for example, improving the embeddability of resin between wirings and improving adhesiveness between the layers, it is preferable to press the board from the top and the bottom during heating.

A thermally cured film obtained by thermal curing of the thermosetting resin composition of one or more embodiments has a low dielectric constant and a low dielectric loss tangent, and has a small transmission loss in a high frequency band. Thus, the thermally cured film can also be suitably used for a printed wiring board for an antenna in which a low-transmission-loss property is required.

EXAMPLES

Hereinafter, one or more embodiments of the present invention will be described in detail by showing examples, which should not be construed as limiting one or more embodiments of the present invention.

SYNTHESIS EXAMPLES

Synthesis Example 1

(Synthesis of Urethane Prepolymer)

16.0 g of methyl triglyme and 20.7 g (0.100 mol) of norbornene diisocyanate as polymerization solvents were put into a reaction vessel, and heated to 80° C. with stirring under a nitrogen flow to be dissolved. To this solution, a solution obtained by dissolving 50.0 g (0.025 mol) of polycarbonate diol ("DURANOL T 5652" manufactured by ASAHI KASEI CORPORATION) and 8.1 g (0.050 mol) of 2,2-bis(hydroxymethyl)butyric acid in 40.0 g of methyl triglyme was added over 1 hour, and the mixture was stirred at 80° C. for 5 hours to obtain an isocyanate-terminated urethane prepolymer containing a carboxy group in the molecule.

(Synthesis of Acid Anhydride-Terminated Urethane Imide Oligomer)

40.0 g of methyl triglyme and 52.0 g (0.100 mol) of 2,2-bis[4-(3,4-dicarboxyphenoxy)phenyl]propane dianhydride (BPADA) was put into a reaction vessel, heated to 80° C. and stirred. To this solution, the urethane prepolymer was added over 1 hour. This solution was stirred at 180° C. for 3 hours to obtain an acid anhydride-terminated urethane imide oligomer solution having a solid content concentration of 60 wt %.

(Hydrolytic Opening at Terminal)

7.2 g (0.400 mol) of pure water was added to the acid anhydride-terminated urethane imide oligomer solution, and heated under reflux at 110° C. for 3 hours to open an acid anhydride group at a terminal, thereby obtaining a carboxylic acid-terminated urethane imide oligomer solution having a solid content concentration of 60 wt %. The carboxylic acid-terminated urethane imide oligomer had a weight average molecular weight of 9,200 and an acid value of 86 mg KOH/g.

Synthesis Example 2

12.1 g of methyl triglyme and 64.0 g (0.400 mol) of norbornene diisocyanate as polymerization solvents were put into a reaction vessel, and heated to 80° C. with stirring under a nitrogen flow to be dissolved. To this solution, a solution obtained by dissolving 19.2 g (0.125 mol) of polycarbonate diol with a number average molecular weight of 2,000 ("DURANOL T 5652" manufactured by ASAHI KASEI CORPORATION) and 2.011 g (0.175 mol) of 2,2-bis(hydroxymethyl)butyric acid in 12.1 g of methyl triglyme was added over 1 hour. This solution was stirred at 80° C. for 5 hours to obtain an isocyanate-terminated urethane prepolymer containing a carboxy group in the molecule.

(Synthesis of Acid Anhydride-Terminated Urethane Imide Oligomer)

13.4 g of methyl triglyme and 13.7 g (0.340 mol) of BPADA were put into a reaction vessel, heated to 80° C. and stirred. To this solution was added the urethane prepolymer over 1 hour, and the mixture was then stirred at 180° C. for 3 hours to obtain an acid anhydride-terminated urethane imide oligomer solution having a solid content concentration of 48 wt %.

(Half-Esterification)

12.8 g (0.400 mol) of methanol was added to the acid anhydride-terminated urethane imide oligomer solution, and heated under reflux at 110° C. for 3 hours to half-esterify an acid anhydride group at a terminal, thereby obtaining a carboxylic acid-terminated urethane imide oligomer solution having a solid content concentration of 48 wt %. The carboxylic acid-terminated urethane imide oligomer had a weight average molecular weight of 21,000 and an acid value of 43 mg KOH/g.

Synthesis Example 3

40.0 g of methyl triglyme and 20.6 g (0.100 mol) of norbornene diisocyanate as polymerization solvents were put into a reaction vessel, and heated to 80° C. with stirring under a nitrogen flow to be dissolved. To this solution, a solution obtained by dissolving 50.0 g (0.025 mol) of polycarbonate diol with a number average molecular weight of 2,000 ("DURANOL T 5652" manufactured by ASAHI KASEI CORPORATION), 3.70 g (0.025 mol) of 2,2-bis (hydroxymethyl)butyric acid and 13.02 g (0.100 mol) of 2-hydroxyethyl methacrylate in 40.00 g of methyl triglyme was added over 1 hour. This solution was heated and stirred at 80° C. for 5 hours to obtain a solution of urethane methacrylate having a carboxy group in the molecule and a methacryloyl group at a terminal (solid content concentration: 52 wt %). The polymer had a weight average molecular weight of 8,600 and an acid value of 18.0 mg KOH/g.

The properties of the solutions and polymers obtained in Synthesis Examples above were evaluated by the following methods.

<Solid Content Concentration>

Measurement was performed according to JIS K 5601-1-2. The drying condition was set to 170° C.×1 hour.

<Weight Average Molecular Weight>

Measurement was performed under the following conditions by gel permeation chromatography (GPC).

Apparatus used: product equivalent to TOSOH HLC-8220 GPC

Column: TSK gel Super AWM-H (6.0 mm I.D.×15 cm)×2 columns from TOSOH CORPORATION Guard column: TSK guard column Super AW-H from TOSOH CORPORATION Eluent: 30 mM LiBr+20 mM $H_3PO_4$ in DMF Flow rate: 0.6 mL/min Column temperature: 40° C.

Detection conditions: RI: polarity (+), response (0.5 sec)

Sample concentration: about 5 mg/mL

Molecular weight standard: PEG (polyethylene glycol)

<Acid Value>

Measurement was performed in accordance with JIS K 5601-2-1.

Examples and Comparative Examples

<Preparation of Thermosetting Resin Composition>

Components (A) to (E) were added at a ratio as shown in Table 1, and uniformly mixed by a three-roller mill to prepare a thermosetting resin composition. The ratios shown in Table 1 are the weight ratios of the solid contents of the components.

As the component (A), the carboxylic acid-terminated urethane imide oligomer solution obtained in Synthesis Example 1 or Synthesis Example 2 above was used.

As the component (B), a solution having a solid content concentration of 16 wt % and obtained by mixing oxazoline group-containing reactive polystyrene ("EPOCROS RPS-1005" manufactured by Nippon Shokubai Co., Ltd., weight average molecular weight: 160,000, amount of oxazoline groups: 0.27 mmol/g) with ethylene diglycol acetate and stirring the mixture for 6 hours was used.

As the component (C), the urethane methacrylate solution obtained in Synthesis Example 3 was used.

As the component (D), a phenoxy epoxy resin ("YL 7891" manufactured by Mitsubishi Chemical Corporation) was used.

As the component (E), particles of aluminum diethylphosphinate ("Exolit OP 935" manufactured by Clariant, average particle diameter: 2.5 μm) were used.

<Production of Thermosetting Resin Film>

The composition was applied onto a 12 μm-thick copper foil with a bar coater so as to have a thickness of 25 μm after drying, and heated in an oven at 80° C. for 20 minutes to remove the organic solvent, thereby forming a laminate including a 25 μm-thick thermosetting resin film (B-stage film) on the copper foil.

[Evaluation]

<Relative Dielectric Constant and Dielectric Loss Tangent>

The laminate was heated at 180° C. for 1 hour to thermally cure the resin film, thereby obtaining a laminate including a thermally cured film on a copper foil. The copper foil of the laminate was removed by etching to obtain a monolayer film composed of a thermally cured film. The thermally cured film was cut into a size of 2 mm×100 mm, and subjected to humidity conditioning in an environment at a temperature of 23° C. and a relative humidity of 55% for 24 hours, and the relative dielectric constant and the dielectric loss tangent were then measured at a measurement frequency of 10 GHz. The measurement was performed using an apparatus for measurement of a dielectric constant by a resonant cavity vibration method ("CP-511" manufactured by Kanto Electronic Application and Development Inc.) and a network analyzer ("E 5071 ENA" manufactured by Keysight Technologies).

<Solder Heat Resistance>

A laminate including a thermally cured film on a copper foil was cut into 3 cm×3 cm, and immersed in a solder bath at 300° C. for 10 seconds to evaluate solder heat resistance in accordance with the JPCA-BM02 standard. The sample after solder immersion was visually observed to determine whether or not there was a change such as deformation or melting marks, and evaluation was performed in accordance with the following criteria.

A: There is no change in whole.

B: There is a change in regions constituting less than 50% of the entire area.

C: There is a change in regions constituting 50% or more of the entire area.

<Embeddability>

In place of the copper foil, a 25 μm-thick polyethylene terephthalate (PET) film was provided as a support substrate, and a laminate including 25 μm-thick thermosetting resin film (B-stage film) on the PET film was produced. On a wiring board on which copper wirings with a wiring height of 12 μm are concentrically provided at a line/space of 50 μm/50 μm, the thermosetting resin film was laminated, and the PET film was peeled off. With the polyimide film laminated on the thermosetting resin film, heat press treatment was performed to thermally cure the resin film, thereby producing a sample for evaluation.

The press condition was set to a pressure of 2 MPa and a pressure application time of 1 hour, and samples were prepared under two temperature conditions of 160° C. and 180° C. A cross-section of each of the sample pressed at 160° C. and the sample pressed at 180° C. was observed to determine whether or not there were bubbles at the interface between the wiring board and the thermally cured film, and evaluation was performed in accordance with the following criteria.

A: There are no bubbles in any of the samples at 160° C. and 180° C.

B: There are no bubbles in the sample at 180° C., and there are bubbles in the sample at 160° C.

C: There are bubbles in both the samples at 160° C. and 180° C.

Table 1 shows the formulations of the thermosetting resin compositions of Examples 1 to 5 and Comparative Examples 1 and 2 and the results of evaluation of the resin films. In "composition" in Table 1, ratios (molar ratios) between the total amount of carboxy groups contained in the component (A) and component (C) and the amount of oxazoline groups contained in the component (B) are also shown.

TABLE 1

|  |  |  | Example 1 | Example 2 | Example 3 | Example 4 | Example 5 | Comparative Example 1 | Comparative Example 2 |
|---|---|---|---|---|---|---|---|---|---|
| Composition | (A) | Synthesis Example 1 | 16 | — | — | — | — | 14 | — |
|  |  | Synthesis Example 2 | — | 30 | 20 | 28 | 45 | — | — |
|  | (B) | Oxazoline-containing polystyrene | 71 | 59 | 65 | 56 | 45 | — | 43 |
|  | (C) | Urethane methacrylate | — | — | — | 5 | — | — | 43 |
|  | (D) | Phenoxyepoxy resin | — | — | 3 | — | — | 74 | — |
|  | (E) | Particles | 13 | 11 | 12 | 11 | 10 | 12 | 14 |
|  |  | Carboxy groups/ oxazoline groups | 1.3 | 1.4 | 0.9 | 1.5 | 2.8 | — | 1.2 |
| Evaluation results |  | Relative dielectric constant | 2.31 | 2.46 | 2.55 | 2.58 | 2.62 | 2.92 | 2.75 |
|  |  | Dielectric loss tangent | 0.003 | 0.003 | 0.003 | 0.003 | 0.004 | 0.019 | 0.006 |
|  |  | Solder heat resistance | A | A | A | A | A | B | C |
|  |  | Embeddability | B | B | B | A | B | C | A |

Each of the thermally cured films produced using the compositions of Example 1 to 5 containing the component (A) and component (B) had a relative dielectric constant of 2.7 or less and a dielectric loss tangent of 0.005 or less, and exhibited excellent dielectric properties. In addition, Examples 1 to 5 exhibited good solder heat resistance and embeddability of resin between wirings.

In Comparative Example 1 where the component (D) (epoxy resin) is contained as a main component, and thermal curing was performed by a reaction of the carboxy group of the component (A) and the epoxy group of the component (D), the thermally cured film had a high relative dielectric constant and dielectric loss tangent, and solder heat resistance and embeddability were insufficient. Comparison of Example 1 with Comparative Example 1 shows that the component (B), which is polystyrene having an oxazoline group, contributes to reduction of the dielectric constant and improvement in heat resistance and embeddability of the cured film.

In Comparative Example 2 where the component (A) was not present, and thermal curing was performed by a reaction between the carboxy group of the component (C) and the oxazoline group of the component (B), the dielectric constant was lower as compared to Comparative Example 1 because the component (B) was present, but the relative dielectric constant and the dielectric loss tangent were larger as compared to Examples 1 to 5, and the solder heat resistance was insufficient. In Examples 1, 2, 4 and 5, the relative dielectric constant and the dielectric loss tangent tended to decrease as the ratio of carboxy groups to oxazoline groups became smaller (i.e., as the amount of residual carboxy groups in the cured film became smaller).

From these results, it is considered that the styrene structural moiety of the component (B) contributes to reduction of the dielectric constant and reduction of the dielectric loss tangent, and further, reduction of the number of residual carboxyl groups by reaction of the oxazoline group of the component (B) with the carboxy of the component (A) (and the component (C)) also contributes to reduction of the dielectric constant and reduction of the dielectric loss tangent. In addition, it is considered that the presence of an imide bond in the component (A) contributes to improvement of heat resistance.

In Example 3, the relative dielectric constant of the cured film was higher as compared to Examples 1 and 2 although the ratio of the carboxy group to the oxazoline group in the composition was smaller as compared to in Examples 1 and 2. It is considered that in Example 3, the epoxy resin of the component (D) reacts with the carboxy group to form a hydroxy group, and therefore the dielectric constant is higher as compared with Examples 1 and 2 where only the oxazoline group of the component (B) reacts with the carboxy group.

In Example 4 where the component (C) as well as the component (A) is used as the carboxy group-containing component, embeddability was improved as compared with other examples. It is considered that the presence of the component (C) lowered the apparent glass transition temperature to improve fluidity, so that even when the resin composition was heated at a relatively low temperature, the resin composition was easily filled between the wirings, resulting in improvement of embeddability.

Although the disclosure has been described with respect to only a limited number of embodiments, those skilled in the art, having benefit of this disclosure, will appreciate that various other embodiments may be devised without departing from the scope of the present disclosure. Accordingly, the scope of the invention should be limited only by the attached claims.

What is claimed is:

1. A thermosetting resin composition comprising:
   a component (A) that is a compound having an imide group and a carboxy group in one molecule; and
   a component (B) that is a polymer having a repeating unit represented by the following general formula (1):

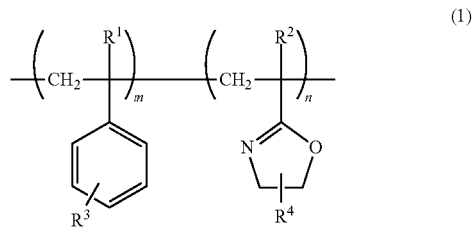

(1)

wherein in the general formula (1), $R^1$ and $R^2$ are each independently a hydrogen atom or a methyl group; $R^3$ is a hydrogen atom or any substituent, and a plurality of $R^3$s may be bonded to form a ring structure; $R^4$ is a hydrogen atom or an alkyl group; and m and n are each independently an integer of 1 or more, and m/n is 1 to 50, wherein an amount of the component (B) in the thermosetting resin composition is 100 to 3000 parts by mass based on 100 parts by mass of a solid content of the component (A), and wherein a molar ratio of a total amount of carboxy groups in the thermosetting resin composition to an amount of oxazoline groups in the component (B) is 0.1 to 3.0.

2. The thermosetting resin composition according to claim 1, wherein the component (A) has an acid value of 5 to 200 mg KOH/g.

3. The thermosetting resin composition according to claim 1, wherein the component (A) has a weight average molecular weight of 1,000 to 30,000.

4. The thermosetting resin composition according to claim 1, wherein the component (A) is a urethane imide oligomer having the carboxy group at a terminal.

5. The thermosetting resin composition according to claim 4, wherein the component (A) is a urethane imide oligomer having a urethane structural unit represented by the following general formula (2) and a terminal structure represented by the following general formula (3):

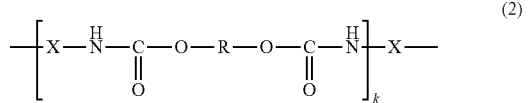

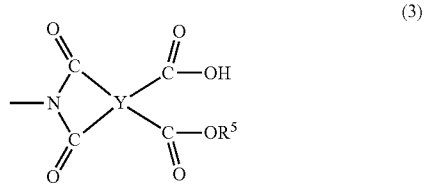

wherein in the general formula (2), R and X are each independently a divalent organic group, and k is an integer of 1 or more; and wherein in the general formula (3), Y is a tetravalent organic group, and $R^5$ is a hydrogen atom or an alkyl group.

6. The thermosetting resin composition according to claim 4, wherein the component (A) contains polycarbonate urethane in a urethane structure moiety.

7. The thermosetting resin composition according to claim 4, wherein the component (A) has the carboxy group at a side chain, and at the terminal, of the urethane imide oligomer.

8. The thermosetting resin composition according to claim 1, further comprising a component (C), wherein the component (C) is a carboxy group-containing compound other than the component (A).

9. The thermosetting resin composition according to claim 8, wherein the component (C) has an ethylenically unsaturated group.

10. The thermosetting resin composition according to claim 8, wherein the component (C) is a urethane (meth) acrylate having a (meth)acryloyl group at both terminals of a molecular chain.

11. The thermosetting resin composition according to claim 1, further comprising fine particles having an average particle diameter of 0.1 to 10 μm.

12. A thermosetting resin film, wherein the thermosetting resin composition set forth in claim 1 is formed in a layered shape.

13. A laminate comprising: a support substrate; and the thermosetting resin film set forth in claim 12 arranged on the support substrate.

14. The laminate according to claim 13, wherein the support substrate is a resin film or a copper foil.

15. The laminate according to claim 13, further comprising a cover film that is temporarily attached onto a surface of the thermosetting resin film.

16. A thermally cured film consisting of a thermally cured product of the thermosetting resin film set forth in claim 12.

17. A printed wiring board comprising:
a wiring disposed on a board; and
a thermally cured film that covers the wiring,
wherein the thermally cured film is one set forth in claim 16.

18. A method for manufacturing a printed wiring board, the method comprising:
laminating the thermosetting resin film set forth in claim 12 on a wiring that is disposed on a board; and
thermally curing the thermosetting resin film.

* * * * *